(12) United States Patent
Schulthess et al.

(10) Patent No.: US 6,426,537 B2
(45) Date of Patent: Jul. 30, 2002

(54) ULTRA-THIN PIEZOELECTRIC RESONATOR

(75) Inventors: Kurt Schulthess, Balm b. Günsberg; Thomas Lüthi, Grenchen, both of (CH)

(73) Assignee: Eta SA Fabriques d'Ebauches, Grenchen (CH)

( * ) Notice: Subject to any disclaimer, the term of this patent is extended or adjusted under 35 U.S.C. 154(b) by 0 days.

(21) Appl. No.: 09/734,681

(22) Filed: Dec. 13, 2000

(30) Foreign Application Priority Data

Dec. 21, 1999 (CH) .............................. 2337/99

(51) Int. Cl.⁷ .......................... H01L 29/84; H01L 29/86
(52) U.S. Cl. ........................................ 257/416; 257/414
(58) Field of Search ................................ 257/414–416

(56) References Cited

U.S. PATENT DOCUMENTS

| | | | | |
|---|---|---|---|---|
| 4,362,961 A | * | 12/1982 | Gerber | 310/370 |
| 5,198,716 A | * | 3/1993 | Godshall et al. | 310/349 |
| 5,260,596 A | | 11/1993 | Dunn et al. | 257/414 |
| 5,543,763 A | | 8/1996 | Oyama | |

FOREIGN PATENT DOCUMENTS

| | | | | |
|---|---|---|---|---|
| EP | 0 356 266 | | 2/1990 | |
| JP | 6-224687 A | * | 8/1994 | ............ H03H/9/58 |
| JP | 7-106909 A | * | 4/1995 | ............ H03H/9/17 |
| WO | 99 59 244 | | 11/1999 | |

* cited by examiner

Primary Examiner—Allan R. Wilson
(74) Attorney, Agent, or Firm—Sughrue Mion, PLLC

(57) ABSTRACT

Encapsulated piezoelectric resonator including on the one hand a central plate (5) made of a piezoelectric material cut to form a frame (6) and a central resonant element (9) connected to said frame (6), the top and bottom faces having a metal coating, on the other hand bottom (11) and top (16) covers, each being formed by a spacing frame (12, 17) made of metal or a metal alloy and a closing plate (14, 19), characterised in that at least one of the elements (12, 14, 17, 19) forming the covers (11, 16) is electrically connected to the frame (6) of the central plate (5) and has an extension (10, 13, 18, 20) bent into a Z shape to bring its distal portion (10a, 13a, 18a, 20a) in line with a covering plate (14, 19) and to form electrical and mechanical connection means situated in a same plane.

7 Claims, 1 Drawing Sheet

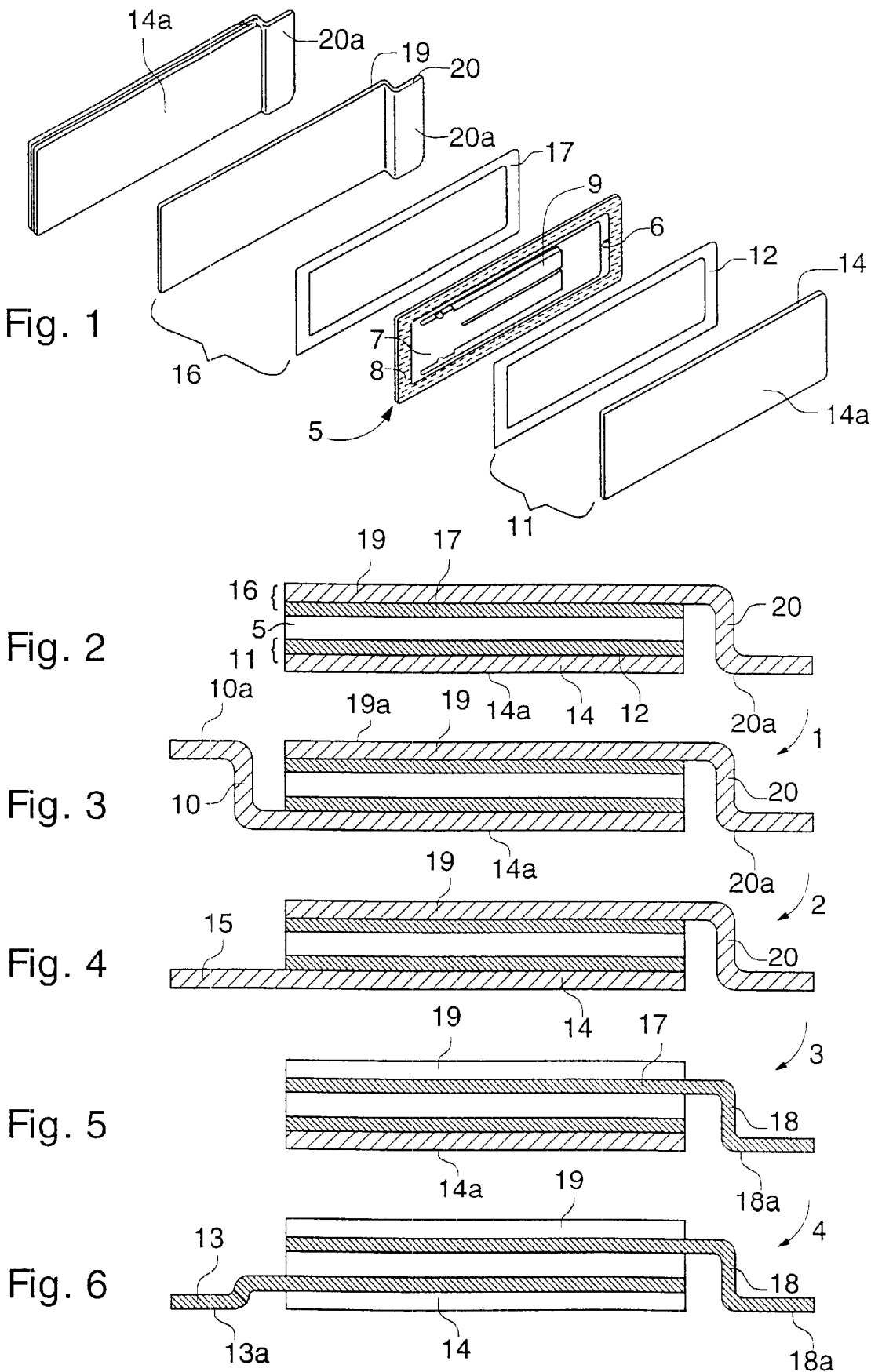

ULTRA-THIN PIEZOELECTRIC RESONATOR

BACKGROUND OF THE INVENTION

The present invention concerns an ultra-thin piezoelectric resonator, and more particularly, a resonator of very small dimensions intended to be secured flat onto the substrate of a printed circuit.

By reducing the dimensions, the thickness of the piezoelectric element can be as small as several tenths of a millimeter and must thus be protected from any external attack or contamination by being hermetically encapsulated in an enclosure, which may be placed in a protective atmosphere or a vacuum.

It is clear that this enclosure must nonetheless include external electric connection means for the excitation electrodes arranged on either side of the piezoelectric element, these connection means usually also forming means for securing the resonator to the substrate.

Since enclosures formed by glass bulbs provided with through connection pins, and metal capsules provided with ceramic pearls for connection pins or assemblies of the metal-ceramic type, have long since been abandoned, the most recent construction principle to which the present invention refers corresponds for example to the device described in U.S. Pat. No. 4,451,754. This device includes a rectangular plate of piezoelectric material cut out to form a frame-support to which is attached the resonant element situated at the center, the two faces being metallised to form both the excitation electrode and, for the frame, means for securing two symmetrical covers formed to leave a space free above the resonant element.

When they are made in a single part, the covers are stamped and each have a connection lug extending parallel to the piezoelectric plate, on either side of it. When they are made in two parts, each cover is formed of a metal frame and a rectangular closing plate, the connection lugs then being able to be formed with the same arrangements as before by extensions of the metal frame.

When the resonator which has just been briefly described, is arranged flat on a substrate, it can be seen that the connection lugs are in parallel planes which are different from the plane of said substrate, which has the drawback of preventing mounting the resonator on the substrate solely by means of these connection lugs. It is well known that a non negligible part of the vibrator power is transmitted to the substrate, which may over the long term have a detrimental effect on the quality and longevity of the resonator if it is not designed with efficient and preferably simple mounting onto the substrate.

SUMMARY OF THE INVENTION

The object of the present invention is to overcome the drawbacks of the aforecited prior art by providing an ultra-thin resonator whose electric connection means are in a same plane and are also used as means for mounting it on a printed circuit substrate.

The invention therefore concerns an encapsulated piezoelectric resonator including on the one hand a central plate made of a piezoelectric material cut to form a frame and a central resonant element connected to said frame, the top and bottom faces having a metal coating, on the other hand bottom and top covers, each being formed by a spacing frame made of metal or a metal alloy and a closing plate, characterised in that at least one of the elements forming the covers is electrically connected to the frame of the central plate and has an extension bent into a Z shape to bring its distal portion in line with a covering plate and to form electrical and mechanical connection means situated in a same plane.

The preferred embodiment is that in which all the portions constituting the covers are metal, the covering plate of the top cover then being the only one to have an extension bent into a Z shape. According to a variant, the bottom plate can also have a planar extension beyond the central plate, and thus allows the securing of the connecting lugs onto a printed circuit to be made easier for example by means of a laser beam.

According to another embodiment, the Z-shaped bent extensions are formed from at least one spacing frame. In the event that each spacing frame is provided with a Z extension, which will evidently be at different places on the periphery of the frame, the top and bottom covering plates could then be formed of an insulating material, such as a thin glass plate.

When the external parts of the covers are made of metal and have to be insulated, it is of course possible to apply an insulating varnish in accordance with known techniques.

Other features and advantages of the invention will appear more clearly upon reading the detailed description of the examples which follow, with reference to the annexed drawings, in which:

BRIEF DESCRIPTION OF THE DRAWING.

FIG. 1 is the perspective diagram of a resonator according to the invention, assembled and blown up; and FIGS. 2 to 6 are side views of different embodiments.

DETAILED DESCRIPTION OF THE INVENTION

FIG. 1 shows in perspective an ultra-thin piezoelectric resonator 1, dismantled so as to be better understood, in a blown up view showing its different constituent parts. FIG. 2 shows the same resonator in a side view. It includes in a known manner a central plate 5 made of a piezoelectric material of very small dimensions. By way of example, the plate has a rectangular surface of 5×1.8 mm and a thickness of 0.15 mm, and it has a central cut out portion allowing a frame 6 to be formed, to which is attached, by one of its small sides, a resonant element 9 represented here by a tuning fork. It is clear that the invention is not limited to a resonant element in the shape of a tuning fork, and that any other configuration of resonant elements would also be able to be used within the scope of the present invention. The bottom and top faces of frame 6 and resonant element 9 have a thin conductive coating 7, obtained by known techniques, such as vacuum deposition. The outer surfaces 8 (only one of which is visible in FIG. 1) of frame 6 constitute the support and sealing surfaces for the other constituent elements of the resonator. Bottom cover 11, i.e. the one which will be applied onto the substrate of a printed circuit is formed of two metal parts: a spacing frame 12 having the same dimensions as surfaces 8 of central plate 5 and a covering plate 14. The top cover, also formed of two metal parts, includes a spacing frame 17 which is identical to frame 12 and a covering plate 19 having an extension 20 bent into a Z shape. As is seen more clearly in a side view in FIG. 2, in which the thickness of the assembled elements has been greatly exaggerated, the first bend arranges an electrically insulating space with the stack of elements and the end of extension 20 forms a clamp 20a whose bottom surface is in the same plane as outer face 14a of bottom covering plate 14. Surfaces 14a and 20 situated in a same plane constitute both the electrical connection means for the electrodes and the means for mounting on the substrate of a printed circuit while assuring great stability of the ultra-thin resonator. According to a variant shown in FIG. 3, it can be seen that the bottom covering plate 14 also has a Z shaped bent extension, said extension being asymmetrical to extension 20 of top covering plate 19 with respect to the median plane of the resonator. This construction has the advantage of providing resonators the direction of which will never have to be discriminated in an assembly chain. The mechanical and electrical mounting onto the substrate of a printed circuit could then be effected by any of surfaces 20a, 14a, extension 10 then not being used, or by surfaces 10a, 19a, extension 20 then not being used.

The assembly of the various elements which have just been described to each other is effected by the known means of welding or soldering or by applying a glue or a conductive cement.

According to a variant which is not shown, spacing frames 12, 17 can be made of an alloy allowing covering plates 14, 19 to be soldered to the frame while arranging a space sufficient for the motion space of resonant element 9. Frames 12, 17 are for example cut of a thin plate of a hotmelt material, such as the alloy Au–Sn (80/20) by stamping. In a similar manner, it is possible to electroshape frames 12, 17 with such an alloy directly either onto covering plates 14, 19, or onto surfaces 8 of the frame of the central piezoelectric element or onto both at the same time. Likewise, it is possible to apply an insulating varnish to all the outer surfaces, with the exception of the securing and connecting zones.

According to a variant shown in FIG. 4, the bottom covering plate 14 may also have a planar extension 15 able to make it easier to secure the resonator onto the substrate. According to another embodiment shown in FIG. 5, the means for connecting the top excitation electrode is formed by a Z shaped extension 18 of spacing frame 17, according to the same principles as those defined hereinbefore. In this case, covering plate 19 has the same contour as that of frame 17 and can be made of an insulating material.

FIG. 6 shows a variant wherein the top and bottom spacing frames 17 and 12 each have a Z shaped bent extension 18 and 13. This embodiment also allows bottom covering plate 14 to be made of an insulating material.

In the examples which have just been described, the Z shaped bent extension or extensions are provided in the width of the resonator. It is clear that they could also be made in all or part of the length of the resonator.

What is claimed is:

1. An encapsulated piezoelectric resonator including:

a central plate, made of a piezoelectric material cut to form a frame, and a central resonant element connected to said frame and having top and bottom faces which are coated with a metal; and bottom and top covers, each being formed by two elements each including a spacing frame, made of a sheet of metal or a metal alloy, and a covering plate, wherein at least one of the elements forming the covers is electrically connected to the frame of the central plate and has an extension bent into a Z shape distant from said central plate to bring its distal portion in line with the covering plate and to form electrical and mechanical connecting means situated in a same plane.

2. A resonator according to claim 1, wherein the top covering plate is made of metal and is provided with the extension bent into a Z shape.

3. A resonator according to claim 1, wherein the top and bottom covering plates are made of metal and each have an extension bent into a Z shape which is asymmetrical with respect to the median plane of the resonator.

4. A resonator according to claim 2, wherein the covering plate of the bottom cover also has a planar extension beyond the central plate.

5. A resonator according to claim 1, wherein the extension bent into a Z shape is formed from at least one of the spacing frames.

6. A resonator according to claim 5, wherein the two spacing frames each have an extension bent into a Z shape.

7. A resonator according to claim 6, wherein the covering plates of the bottom and top covers are electrically insulated.

* * * * *